United States Patent
Doyle et al.

(10) Patent No.: US 6,489,655 B2
(45) Date of Patent: Dec. 3, 2002

(54) INTEGRATED CIRCUIT WITH DYNAMIC THRESHOLD VOLTAGE

(75) Inventors: Brian S. Doyle, Cupertino, CA (US); Brian Roberds, Santa Clara, CA (US); Rafael Rios, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/782,540

(22) Filed: Feb. 12, 2001

(65) Prior Publication Data

US 2001/0014494 A1 Aug. 16, 2001

Related U.S. Application Data

(62) Division of application No. 09/337,174, filed on Jun. 21, 1999, now Pat. No. 6,261,878.

(51) Int. Cl.[7] .............................................. H01L 27/01
(52) U.S. Cl. ........................... 257/347; 257/57; 257/66; 257/353; 257/386
(58) Field of Search ................................. 257/347, 353, 257/66, 386, 57

(56) References Cited

U.S. PATENT DOCUMENTS

| | | | |
|---|---|---|---|
| 5,877,046 A | * | 3/1999 | Yu et al. ..................... 438/151 |
| 6,031,261 A | * | 2/2000 | Kang ........................... 257/302 |
| 6,249,027 B1 | * | 6/2001 | Burr ............................ 257/350 |

FOREIGN PATENT DOCUMENTS

JP 2-178965 * 11/1990

OTHER PUBLICATIONS

Stephen C. Kuehne et al, "SOI MOSFET with Buried Body strap by Wafer Bonding" IEEE Transactions on Electronic Devices, vol. 45, No. 5, May 1998.*

Stephen C. Kuehne et al, "Deep sub–micron SOI Mosfet with buried body strap" IEEE International SOI conference, Oct. 1996.*

Clement Wann et al., Channel Profile Optimization and Device Design for Low–Power High–Perfomance Dynamic–Threshold MOSFET, IEEE 1996, UC Berkeley, CA, USA.

Fariborz Assaderaghi et al., A Dynamic Threshold Voltage MOSFET (DTMOS) for Ultra–Low Voltage Operation, IEEE 1994, UC Berkeley, Berkeley, CA, USA.

* cited by examiner

Primary Examiner—Nathan J. Flynn
Assistant Examiner—Ahmed N. Sefer
(74) Attorney, Agent, or Firm—Mark V. Seeley

(57) ABSTRACT

An integrated circuit and method for making it are described. The integrated circuit includes a first insulating layer formed on a substrate and a body strap of a first conductivity type that is formed on the first insulating layer. A second insulating layer is formed on the first insulating layer adjacent to the body strap and a film is formed on the second insulating layer. The integrated circuit also includes a gate electrode formed on the film. A plurality of doped regions of a second conductivity type are formed within the film that extend from the surface of the film to the surface of the second insulating layer. The doped regions have junctions that are each spaced from the body strap by at least about 500 angstroms.

10 Claims, 10 Drawing Sheets

US 6,489,655 B2

INTEGRATED CIRCUIT WITH DYNAMIC THRESHOLD VOLTAGE

This is a Divisional Application of Ser. No.: 09/337,174 filed Jun. 21, 1999, now U.S. Pat. No. 6,261,878.

FIELD OF THE INVENTION

The present invention relates to integrated circuits and a method for making them.

BACKGROUND OF THE INVENTION

As transistor gate lengths continue to shrink, threshold voltages ($V_t$) continue to decrease. Below 1.0 volts, it may become difficult to balance adequate current drive with acceptable leakage current. One way to address this problem is to design a device that has a dynamic threshold voltage, i.e., a device that has a lower $V_t$ when the device is turned on than when the device is turned off. By varying the threshold voltage in this way, even a low voltage device may provide a high drive current while continuing to maintain low subthreshold leakage.

Devices having a dynamic threshold voltage may be made by tying a body strap formed below the transistor's channel to the transistor's gate electrode, as described by Hu, et al., "A Dynamic Threshold Voltage MOSFET (DTMOS) for Ultra-Low Voltage Operation," Int'l Electron Devices Meeting Technical Digest, 1994, pp. 809–812; and Hu et al., "Channel Profile Optimization and Device Design for Low-Power High-Performance Dynamic-Threshold MOSFET," Int'l Electron Devices Meeting Technical Digest, 1996, pp. 113–116.

Such devices may use silicon-on-insulator ("SOI") technology to electrically isolate the body strap from the junctions and adjacent transistors. FIG. 1 illustrates such a device, which includes relatively thick silicon film 104 formed on oxide 103. As shown, body strap 102 is separated from junctions 181 and 111, which correspond to the lower boundaries for source 106 and drain 107, respectively. Because of that separation, the capacitance that may result, when the device is turned on, can slow down the rate at which the body potential increases in response to an increase in the voltage applied to gate electrode 105.

One way to address that problem is to use a relatively thin silicon layer instead of a relatively thick layer. FIG. 2 illustrates such a device, which includes relatively thin silicon film 204 formed on oxide 203. When a thin film is used, however, misalignment between body strap 202 and gate electrode 205 can cause a short circuit between body strap 202 and one of the junctions, e.g., junction 211 in the device shown here.

There is a need for a device that does not include such short circuits, or produce unacceptable capacitance that slows down the rate of body potential increase when the device is turned on. There is also a need for a method for making such a device.

SUMMARY OF THE INVENTION

An integrated circuit and method for making it are described. The integrated circuit includes a first insulating layer formed on a substrate and a body strap of a first conductivity type that is formed on the first insulating layer. A second insulating layer is formed on the first insulating layer adjacent to the body strap and a film is formed on the second insulating layer. A gate electrode is formed on the film and a plurality of doped regions of a second conductivity type are formed within the film that extend from the surface of the film to the surface of the second insulating layer. The doped regions have junctions that are each spaced from the body strap by at least about 500 angstroms.

DETAILED DESCRIPTION OF THE PRESENT INVENTION

Figure 3:
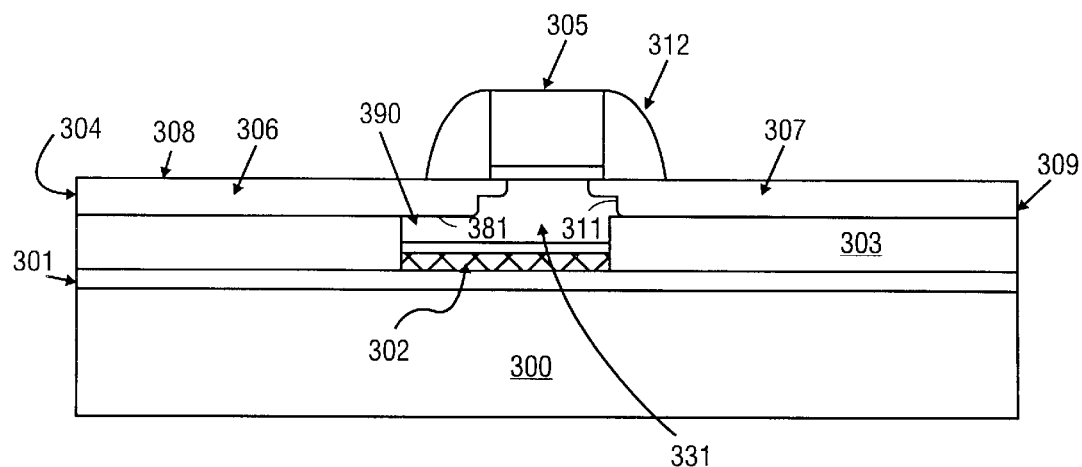
FIG. 3 is an illustration of a cross-section of a section of an embodiment of the integrated circuit of the present invention.

An improved integrated circuit and method for making it are described. FIG. 3 is an illustration of a cross-section of a section of an embodiment of the integrated circuit of the present invention that includes substrate 300 upon which is formed first insulating layer 301. A body strap 302 of a first conductivity type is formed on first insulating layer 301. Second insulating layer 303 is formed on insulating layer 301 adjacent to body strap 302. Film 304 is formed on second insulating layer 303 and layer 390. Film 304 extends from surface 308 of film 304 to surface 309 of insulating layer 303. Gate electrode 305 is formed on top of film 304, and doped regions 306, 307 of a second conductivity type are formed within film 304. Spacers 312 are shown formed on the sides of gate electrode 305. Spacers 312 space a heavy N+ (or P+) implant from gate electrode 305, which may be combined with an earlier N− (or P−) implant to form doped regions 306, 307.

As shown in FIG. 3, doped regions 306, 307 extend from surface 308 of film 304 to surface 309 of second insulating layer 303. Doped regions 306, 307 have junctions 381, 311, respectively. Each junction is spaced from body strap 302 by at least about 500 angstroms and preferably at least about 1,000 angstroms. FIG. 3 shows some degree of misalignment between gate electrode 305 and body strap 302. Some misalignment is inevitable given that gate electrode 305 must be formed on film 304 after body strap 302 is formed. Although FIG. 3 shows gate electrode 305 shifted to the right with respect to body strap 302, gate electrode could be shifted to the left instead. Gate electrode 305 is shown covering a significant portion of body strap 302. Although significant overlap between gate electrode 305 and body strap 302 is preferred, such overlap is not necessary for a device to benefit from the advantages that the present invention provides. Although not shown, those skilled in the art will appreciate that body strap 302 may be tied to gate electrode 305 in the conventional manner.

The device shown in FIG. 3 is preferably an SOI structure where substrate 300, layer 390 and film 304 preferably comprise silicon, and insulating layer 301 preferably comprises an oxide. Other materials, however, may be used to make such structures, as will be apparent to those skilled in the art. Body strap 302 preferably comprises a low resistance region, such as one that includes N+ or P+ doped silicon or a silicide. Insulating layer 303 preferably comprises silicon dioxide. Body strap 302, however, could alternatively be formed from other conductive materials and insulating layer 303 could be formed from a different kind of insulating material. In the embodiment of the present invention illustrated in FIG. 3, the surface of body strap 302 preferably is formed between about 1,500 and about 2,000 angstroms below surface 308 of film 304.

The device shown in FIG. 3 may comprise a conventional SOI structure or, alternatively, comprise a structure where insulating layer 303 and layer 390, which lies beneath film 304 and contains body strap 302, may be bonded to an oxidized substrate, which comprises insulating layer 301 and substrate 300. In the embodiment shown in FIG. 3, film 304 preferably is less than about 1,000 angstroms thick, as measured from surface 308 of film 304 to surface 309 of insulating layer 303.

Gate electrode 305 may comprise any material that can be used to form such a structure, such as doped polysilicon or doped polysilicon capped with another conductive material to form a silicide. As shown in FIG. 3, gate electrode 305 overlaps at least part of body strap 302, and the gate length of gate electrode 305 is less than the width of body strap 302. Doped regions 306, 307, which may comprise the source and drain for the device, may be formed by depositing impurities into film 304, then applying one or more thermal steps. Doped regions 306, 307 should have a conductivity type opposite to the conductivity type of body strap 302. Where the conductivity type of body strap 302 is "P," the conductivity type of doped regions 306, 307 should be "N," and vice versa.

Junction edges 381 and 311, which correspond to the lower boundaries of doped regions 306 and 307, respectively, should be spaced at least about 500 angstroms from body strap 302. Such spacing may ensure that the capacitance produced between junctions 311 and 381 and body strap 302 does not significantly slow down the rate at which the body potential increases in response to increasing the voltage applied to gate electrode 305. Such spacing may be created by separating the N+ (or P+) junctions 311, 381 from the P+ (or N+) body strap 302, by placing body strap 302 below surface 309 of layer 303, as shown in FIG. 3.

When film 304 is less than about 1,000 angstroms thick, the distance between body strap 302 and gate electrode 305 should be at least 50% greater than the distance between surface 309 of layer 303 and surface 308 of film 304. For example, when film 304 is about 1,000 angstroms thick, the surface of body strap 302 preferably should be at least about 1,500 angstroms from gate electrode 305.

Figure 1:
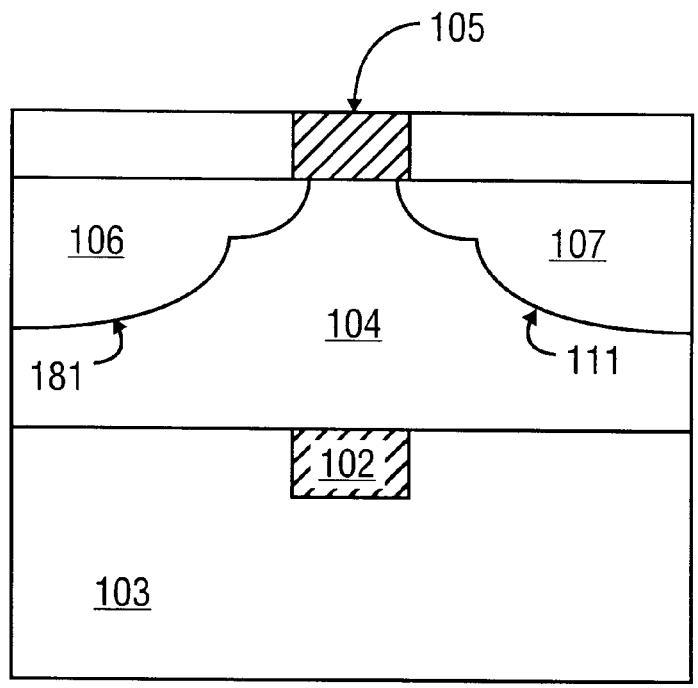
FIG. 1 is an illustration of a cross-section of an SOI device that includes a relatively thick silicon film and a body strap used to provide a dynamic $V_t$.
Figure 2:
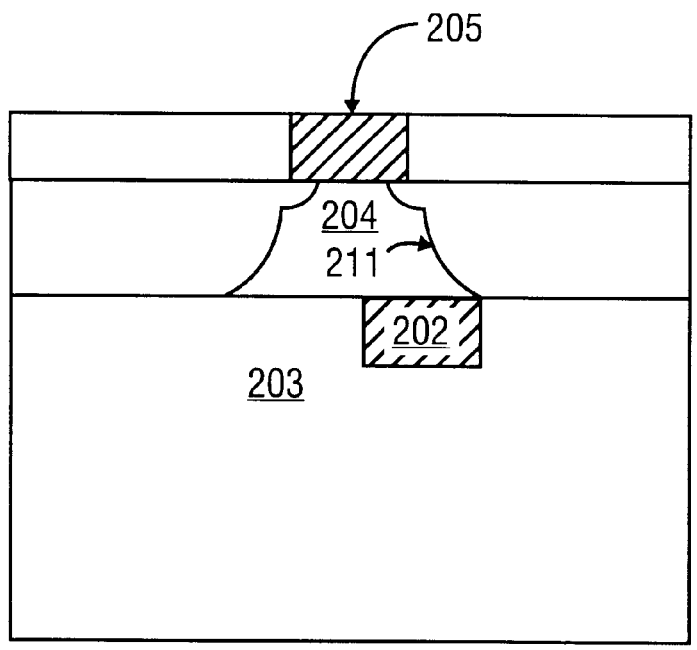
FIG. 2 is an illustration of a cross-section of an SOI device that includes a relatively thin silicon film and a body strap used to provide a dynamic $V_t$.

This increased spacing allows body strap 302 to be oversized, i.e, the body strap may have a width that is greater than the gate length. Such an oversized body strap should extend into the region beneath channel 331, and thus enable the device to benefit from the advantages that a dynamic $V_t$ provides, even when misalignment between gate electrode 305 and body strap 302 is relatively severe. If body strap 302 is not separated from gate electrode 305 by a sufficient distance, then misalignment between the oversized body strap and the gate electrode could produce a device that suffers from unacceptable capacitance created when the body strap is placed too close to the junctions. In the extreme case, a short circuit between body strap 302 and one of the junctions 311, 381 could result. Such a device is illustrated in FIG. 2.

Figure 4:
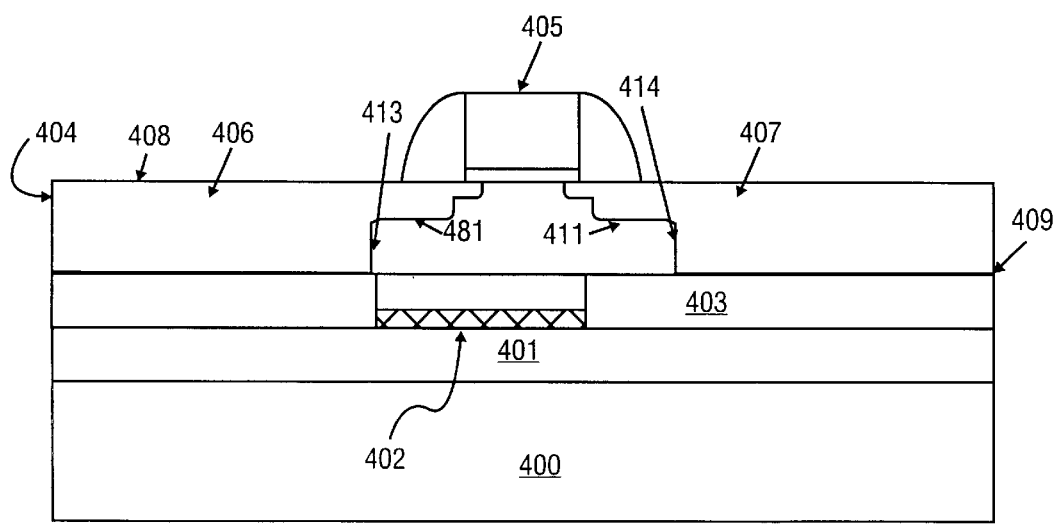
FIG. 4 is an illustration of a cross-section of a section of a second embodiment of the integrated circuit of the present invention.

FIG. 4 is an illustration of a cross-section of a section of a second embodiment of the integrated circuit of the present invention. Like the embodiment shown in FIG. 3, the device shown in FIG. 4 includes substrate 400, first insulating layer 401, body strap 402, second insulating layer 403, film 404, gate electrode 405, and doped regions 406, 407. Like the embodiment shown in FIG. 3, doped regions 406, 407 extend from surface 408 of film 404 to surface 409 of second insulating layer 403, and junctions 481 and 411 of doped regions 406, 407 are spaced from body strap 402 by at least about 500 angstroms. Body strap 402 is tied to gate electrode 405 (not shown).

Unlike the embodiment shown in FIG. 3, film 404 of the device shown in FIG. 4 is greater than about 1,000 angstroms thick. In addition, body strap 402 preferably comprises doped polysilicon. In addition, FIG. 4 shows regions 413, 414 where additional impurities have been deposited. Depositing impurities into regions 413, 414 serves to extend the N+, N− (or P+, P−) regions that form the upper portion of doped regions 406, 407 from surface 408 of film 404 to surface 409 of insulating layer 403. By extending the N+, N− (or P+, P−) regions in this manner, the capacitance between doped regions 406, 407 and body strap 402 may be reduced from the capacitance that otherwise would have resulted had those regions not been extended.

Set forth below is a description of preferred processes for making the integrated circuits described above, made with reference to FIGS. 5a–5f, FIGS. 6a–6h, and FIGS. 7a–7i. Also set forth below is a description of a process, made with reference to FIGS. 8a–8c, that combines certain steps from the embodiments disclosed with reference to FIGS. 6a–6h and FIGS. 7a–7i to make still another embodiment of the integrated circuit of the present invention.

Those figures illustrate cross-sections that reflect the structures resulting after performing certain process steps. FIGS. 5a–5f and 6a–6h demonstrate alternative methods for making the integrated circuit represented by FIG. 3. FIGS. 7a–7i demonstrate a method for making the integrated circuit represented by FIG. 4.

To make the integrated circuit represented by FIG. 3, in accordance with the steps illustrated by FIGS. 5a–5f, SOI structure 595 may be used that includes first layer 590 of semiconductor material that is formed on first insulating layer 501, which in turn is formed on substrate 500. Methods for forming such an SOI structure include separation by implanted oxygen (SIMOX) or Bonded and Etchback (BESOI)—as is well understood by those skilled in the art. SOI structure 595 preferably has a first layer 590 that is between about 1,000 and 3,000 angstroms thick and an insulating layer 501 that is less than about 1,500 angstroms thick.

Figure 5A:
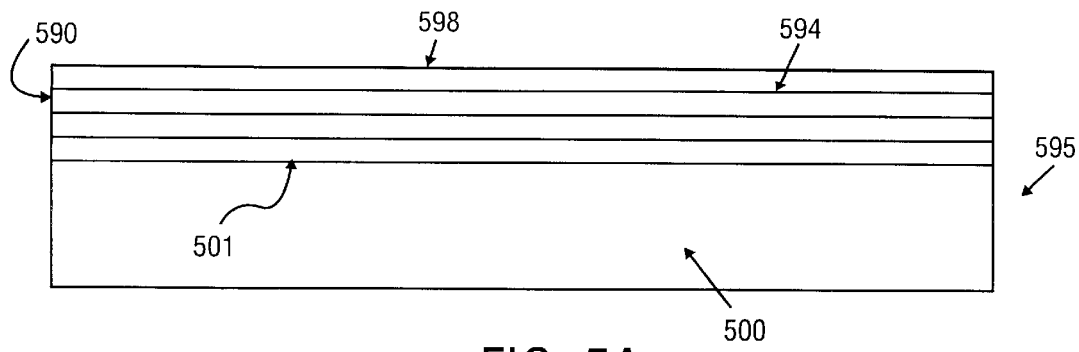
FIGS. 5a–5f are illustrations of cross-sections that reflect structures that may result after certain steps are used to make the integrated circuit of the present invention.

Impurities are deposited into first layer 590, preferably by implanting into layer 590 ions having a first conductivity type. These deposited impurities will be used to create the body strap, as described below. For forming an n-MOS device that will include a P+ body strap, boron or indium ions preferably should be implanted. For forming a p-MOS device that will include an N+ body strap, arsenic or antimony ions preferably should be implanted. Depending upon the structure to be made, ions should be implanted at between about $1 \times 10^{15}$ and $1 \times 10^{17}$ particles/cm$^3$ at an energy sufficient to generate a heavily doped band having a surface that is between about 500 and about 1,000 angstroms below surface 598 of SOI structure 595. A cross-section of the resulting device is shown in FIG. 5*a*, which shows region 594 that includes the deposited impurities formed within layer 590.

Figure 5B:
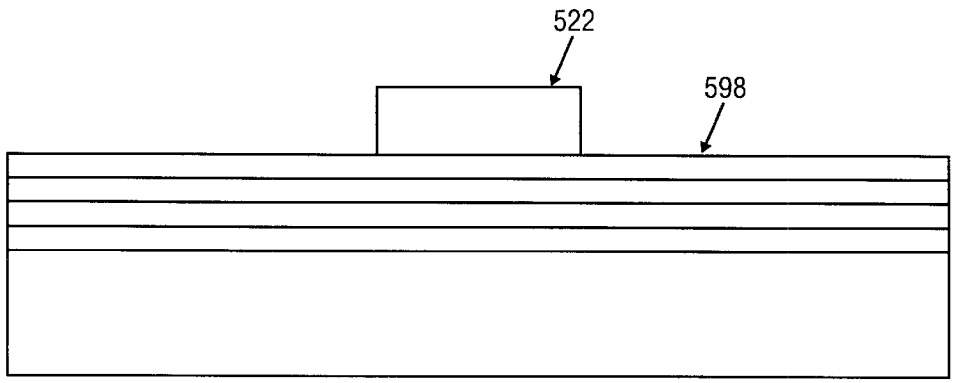

Next, hard mask layer 522 is formed on top of surface 598 by applying conventional techniques for forming such a mask. Mask 522, which may be about 2,000 angstroms thick and may be made from silicon nitride, silicon dioxide or another suitable material, defines the location where the gate electrode will be formed. In this embodiment of the present invention, mask 522 is longer than the gate electrode will be. Such an oversized mask helps ensure that part of the subsequently formed channel will electrically contact the body strap, even if the gate electrode and body strap are misaligned to some degree. A cross-section of the device resulting from the mask formation step is shown in FIG. 5*b*.

Figure 5C:
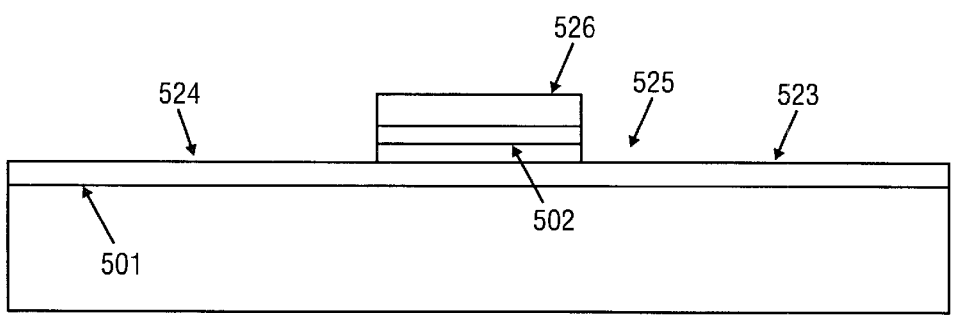

After forming hard mask 522, unmasked portions of layer 590 are removed down to surface 523 of insulating layer 501. An etching process may be used to produce trenches 524, 525, although other processes may be used. To etch layer 590, chlorine chemistry, such as $BCl_3Cl_2$, $H_2Cl_2/SiCl_4$, $ChCl_3/O_2/N_2$, or other suitable etch chemistry may be used, as will be apparent to those skilled in the art. After trenches 524, 525 are formed, mask 522 is removed, e.g., by using an etchant that is selective for the material used to make hard mask 522 over the material used to make layer 590. A cross-section of the resulting device is shown in FIG. 5*c*, in which remnants 526 of layer 590 enclose body strap 502.

Figure 5D:
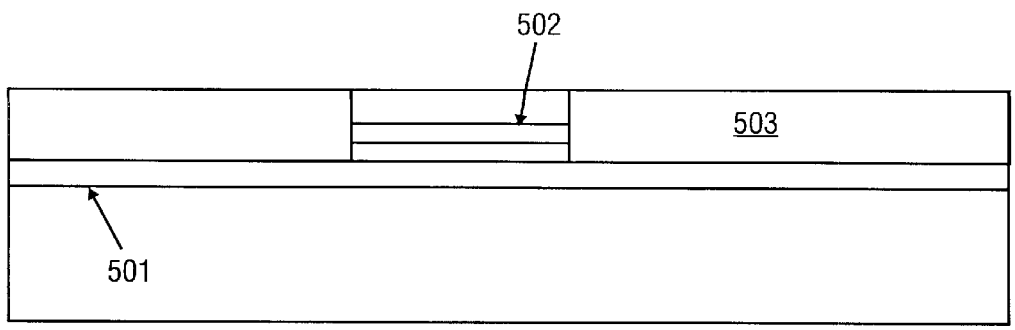

Next, trenches 524, 525 are filled forming second insulating layer 503 adjacent to body strap 502. Preferably, insulating layer 503 comprises silicon dioxide or silicon oxinitride. When silicon dioxide, that material may be deposited using any suitable process known in the art, e.g., by using tetraethyl orthosilicate ("TEOS") in a plasma enhanced chemical vapor deposition ("PECVD") process. Alternatively, some other physical or chemical vapor deposition process may be used to deposit silicon dioxide onto insulating layer 501 to form insulating layer 503. After that deposition step, the surface may be planarized, such as by using a chemical mechanical polishing step. A cross-section of the resulting structure is shown in FIG. 5*d*, where layer 503 is preferably between about 1,000 and about 3,000 angstroms thick.

Figure 5E:
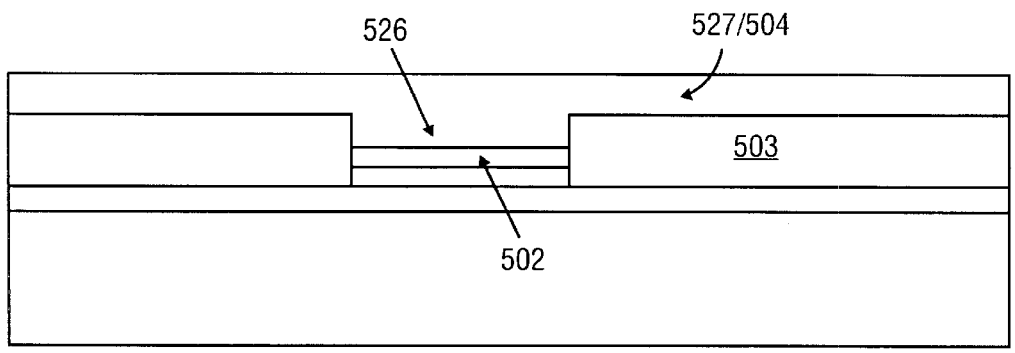

In this embodiment of the method for forming the integrated circuit represented by FIG. 3, an epitaxial lateral overgrowth ("ELO") process is used to form an epitaxial layer of silicon 527 on top of remnants 526 of layer 590, which also comprise silicon, and on top of insulating layer 503 to produce film 504. Epitaxial layer 527 is preferably less than about 1,000 angstroms thick. Such an ELO process may be performed using conventional process steps, but preferably at temperatures sufficiently low to prevent dopants from diffusing from body strap 502 into remnants 526. FIG. 5*e* represents the resulting structure after ELO layer 527 is polished back.

Conventional process steps may follow for forming gate electrode 505 on top of gate oxide 530 formed on top of film 504, and for forming doped regions 506, 507 adjacent to gate electrode 505 and within film 504. The term "adjacent," as used herein, refers to one structure being in close proximity to another and does not necessarily mean that structures are perfectly aligned or abut one another. For example, although doped regions 506, 507 are "adjacent" to gate electrode 505, as shown they extend a relatively short distance underneath gate electrode 505. Doped regions that extend a relatively small distance below a gate electrode or spacer, or are spaced a relatively small distance from such structures, are considered to be adjacent to such structures as that term in used in this specification and in the appended claims.

Figure 5F:
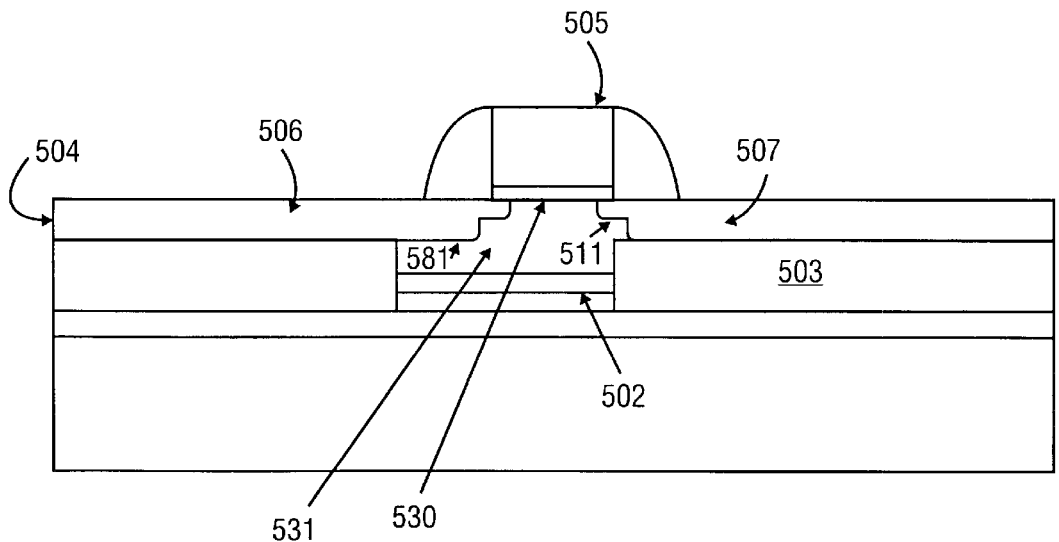

Gate electrode 505 may be aligned with body strap 502 using conventional alignment techniques. As shown in FIG. 5*f*, the gate length for gate electrode 505 is less than the width of body strap 502. Using such an oversized body strap helps ensure electrical contact between body strap 502 and channel 531, even when gate electrode 505 is not perfectly aligned with body strap 502—as is the case illustrated here. Also, as shown in FIG. 5*f*, body strap 502 is separated from junctions 581, 511. That separation, which preferably is at least about 500 angstroms, may ensure that the capacitance generated between junctions 581, 511 and body strap 502 will be lower than would have resulted if the junctions and body strap had been located closer to each other.

An alternative method for making the integrated circuit represented by FIG. 3 is illustrated in FIGS. 6*a*–6*h*. This alternative technique uses an ion-cut/bonded etch-back approach to form a device having a body strap separated from the junctions. This approach exposes the back side of the device to processing before it is inverted to enable the transistor to be formed on the opposite side.

Figure 6A:
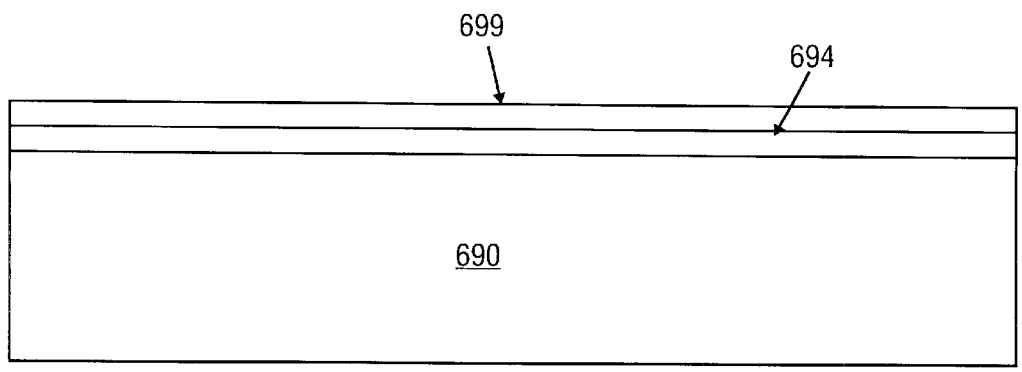
FIGS. 6a–6h are illustrations of cross-sections that reflect structures that may result after certain steps are used to make the integrated circuit of FIG. 3 following a second method for making the integrated circuit of the present invention.

As shown in FIG. 6*a*, impurities for creating the body strap are deposited into a first layer 690 to form doped band 694. Like the method described above, such impurities preferably are deposited by implanting boron or indium ions, for making a P+ body strap for an n-MOS device, or by implanting arsenic or antimony ions, for making an N+ body strap for a p-MOS device. Alternatively, however, impurities may be deposited on surface 699 of layer 690, then subjected to thermal treatment, causing them to diffuse into that layer to form a doped band that extends from the surface of layer 690 to a depth of between about 500 angstroms and about 1,000 angstroms below that surface.

Figure 6B:
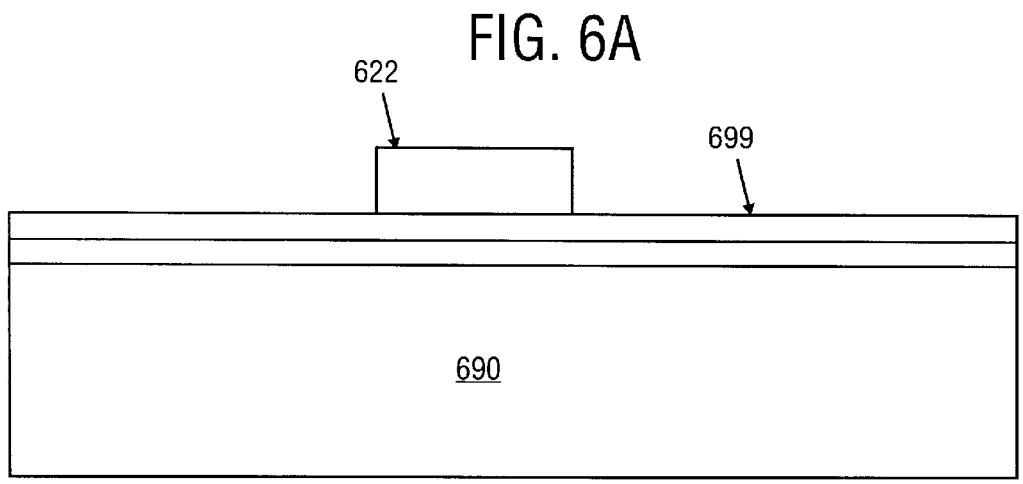
Figure 6C:
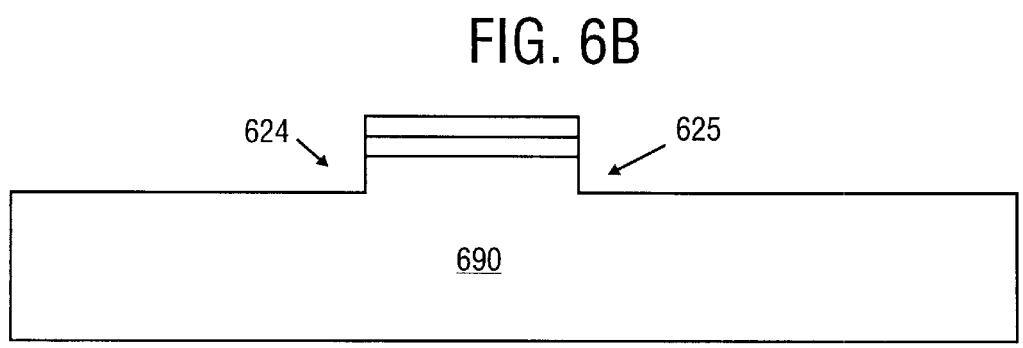
Figure 6D:
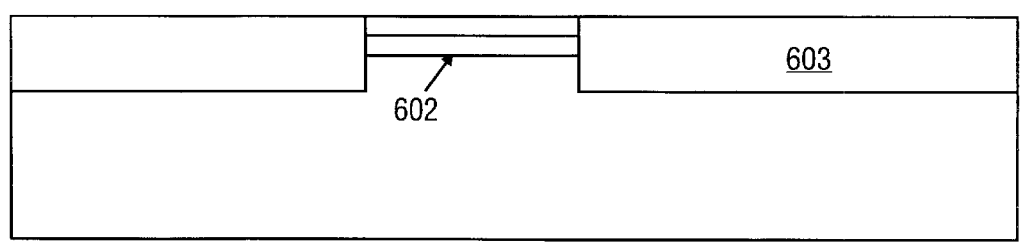
Figure 6E:
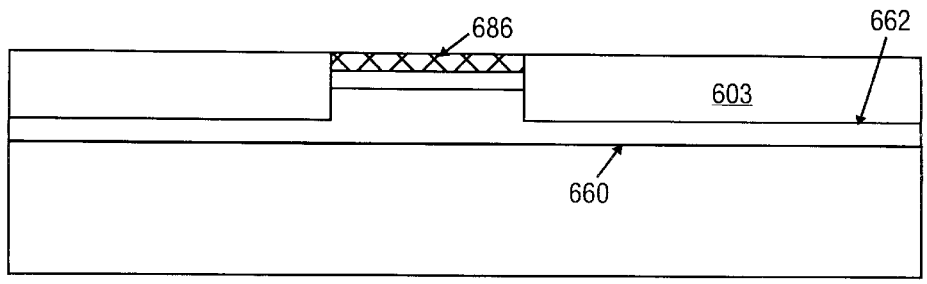

Next, also like the method described above, hard mask 622 may be formed on surface 699 of layer 690, as shown in FIG. 6*b*. Mask 622 is the gate mask, also shown in this embodiment to be oversized to allow for some degree of misalignment between the gate and the body strap. After the mask formation step, portions of first layer 690 are removed to create trenches 624, 625 to produce the structure shown in FIG. 6*c*. Following the trench formation step, insulating layer 603 is formed adjacent to body strap 602 preferably by depositing silicon dioxide over the surface of the device, followed by applying a chemical mechanical polishing step, to produce the structure shown in FIG. 6*d*.

A metal, such as tungsten, may then be deposited on the surface of that structure. That metal may be heated at a temperature that exceeds about 700° C. Such a heating step causes the metal to react with the silicon, which contains body strap 602, to create low resistance silicide 686. That reaction takes place over the silicon only, not over oxide 603. The unreacted metal is removed from the surface of oxide 603 by applying, for example, a conventional wet etch process. That etch step may be followed by another oxide deposition process, e.g., a PECVD process using TEOS, then a polished back step to produce the structure shown in FIG. 6e. By adding a suicide to body strap 602, the resulting body strap will have a much lower resistance, when compared to a body strap like body strap 502 shown in FIG. 5f which does not include such a silicide.

Figure 6F:
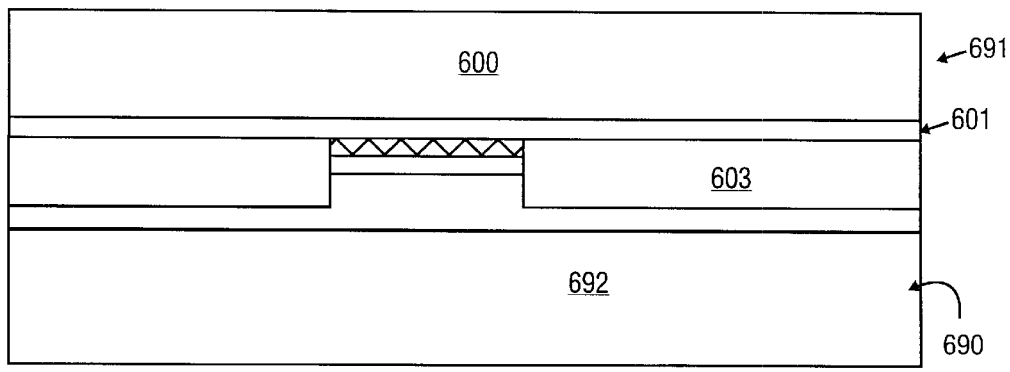
Figure 6G:
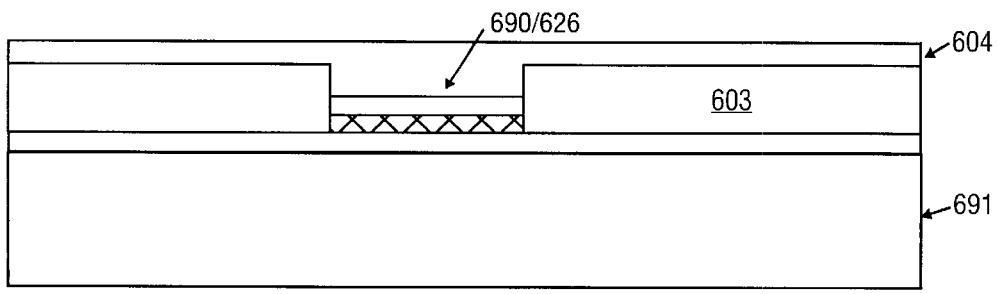

At this point, and as described in Ser. No. 08/884,921 filed Jun. 30, 1997, assigned to this application's assignee, ionized hydrogen is implanted into layer 690. Hydrogen preferably is implanted at between about $2 \times 10^{16} - 2 \times 10^{17}$ particles/cm$^3$ and at an energy sufficient to produce continuous stress surface 660 at a distance about 1,000 angstroms below underlying surface 662 of insulating layer 603. Following that step, oxidized substrate 691, which includes insulating layer 601 formed on substrate 600, is placed on top of layer 690 and insulating layer 603, as shown in FIG. 6f.

This assembly of layer 690, insulating layer 603 and oxidized substrate 691 is then heated, preferably to a temperature between about 400°–600° C. until portion 692 of layer 690 delaminates from layer 690 creating film 604. Portion 692 is removed and heating is further continued at a temperature preferably between about 800°–1000° C. until a firm bond is formed between layer 690 and insulating layer 603, and oxidized substrate 691. This assembly, which includes insulating layer 603 and remnants 626 of layer 690 bonded to oxidized substrate 691, is then inverted. A subsequent polishing step applied to the surface of film 604 produces the structure shown in FIG. 6g.

Figure 6H:
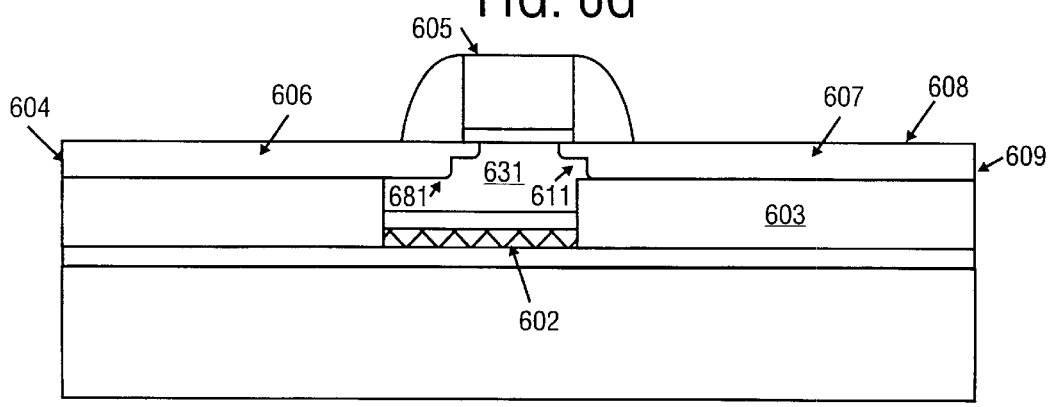

Using body strap 602 as an alignment mark, gate electrode 605 is formed on the surface of film 604 to overlap at least part of body strap 602—as shown in FIG. 6h. By using an oversized body strap, contact between body strap 602 and channel 631 may be ensured. Subsequently, doped regions 606, 607 are formed adjacent gate electrode 605. Doped regions 606, 607 extend from surface 608 of film 604 down to surface 609 of insulating layer 603. Doped regions 606, 607 are preferably spaced from body strap 602 by at least about 500 angstroms. Such separation may ensure less capacitance between junctions 681, 611 and body strap 602 results when an increased voltage is applied to gate electrode 605, than would result had the junctions and body strap been located closer together.

FIGS. 7a–7i illustrate one embodiment of a process that may be used to make the integrated circuit represented by FIG. 4. This method produces an SOI device having a relatively thick film formed on top of the insulating layer. The resulting device should, however, ensure that the capacitance generated between the junctions and body strap, when an increased voltage is applied to the gate electrode, will be less than would have resulted had the junctions been spaced further from the body strap. Like the method illustrated in FIGS. 6a–6h, this method applies an ion-cut/bonded etch-back approach to form such a device.

Figure 7A:
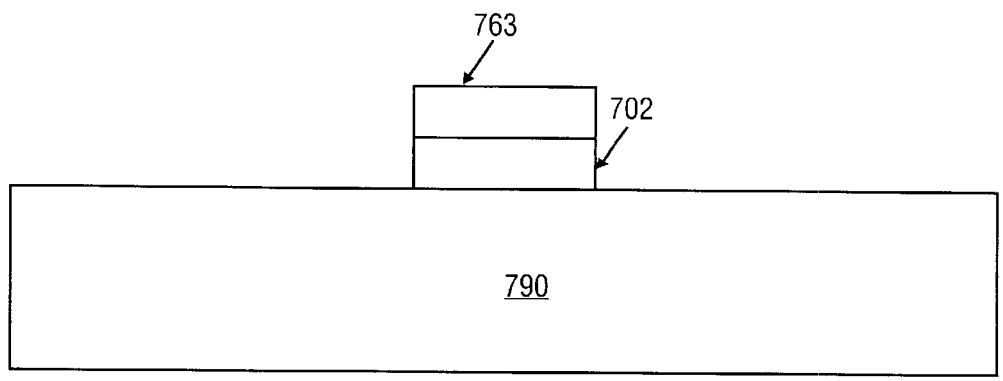
FIGS. 7a–7i are illustrations of cross-sections that reflect structures that may result after certain steps are used to make the integrated circuit of FIG. 4.

As shown in FIG. 7a, polysilicon layer 702 may be formed on the surface of first layer 790. Polysilicon layer 702 preferably is between about 1,000 angstroms and 2,000 angstroms thick and doped to about $2 \times 10^{16} - 2 \times 10^{17}$ particles/cm$^3$ with indium or boron for making a P+ body strap or with arsenic or antimony for making an N+ body strap. Hard mask 763, which preferably comprises an oxide, is formed on top of polysilicon layer 702. The resulting structure may be formed using conventional deposition and etching steps. Although several techniques for forming such a structure exist, one such technique deposits a polysilicon layer over first layer 790, dopes that layer, deposits a masking layer over the doped polysilicon layer, then etches the two layers to form the resulting structure. Hard mask 763 prevents impurities from being deposited into polysilicon layer 702 during a subsequent doping step. Polysilicon layer 702 will eventually form the body strap for the device.

Figure 7B:
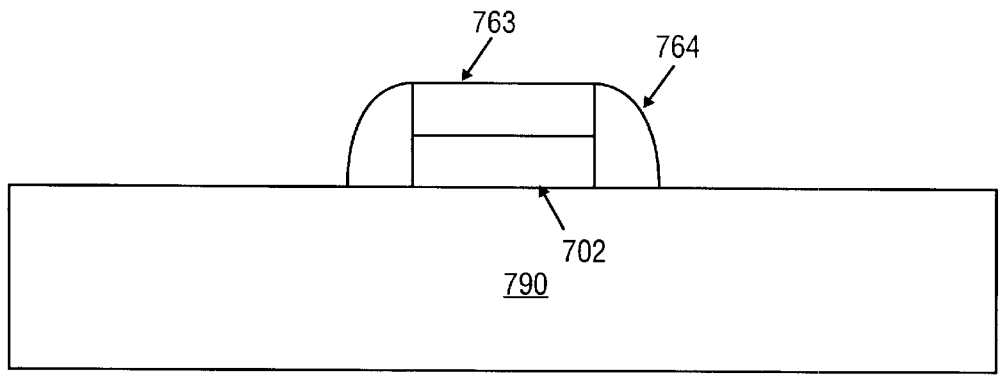

Next, spacers 764 are formed on the sides of polysilicon layer 702 and hard mask 763. Spacers 764 are formed to space a subsequent implant from the sides of polysilicon layer 702. A preferred method for forming spacers 764 includes the following steps. First, a silicon nitride layer is deposited over the entire surface of the structure. Next, an anisotropic etch step is applied to remove that layer from the device, except where it lies against the sides of polysilicon layer 702 and hard mask 763. The resulting structure is shown in FIG. 7b. By using an anisotropic etch process that selects for silicon nitride over silicon, or whatever other material is used to form layer 790, the silicon nitride may be removed without etching into layer 790.

Figure 7C:
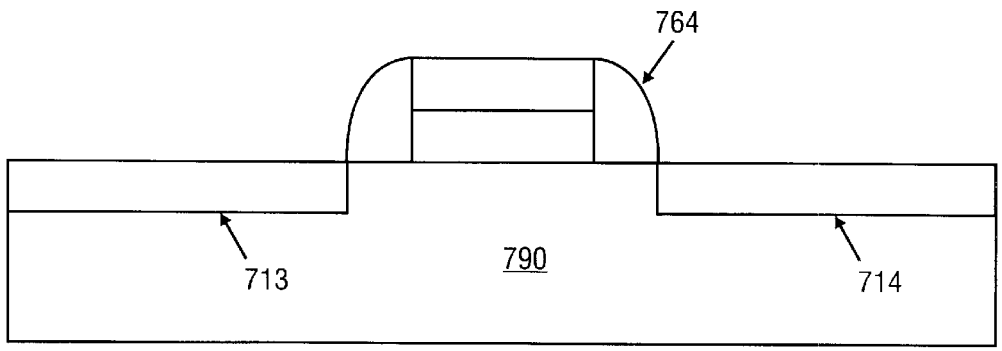
Figure 7D:
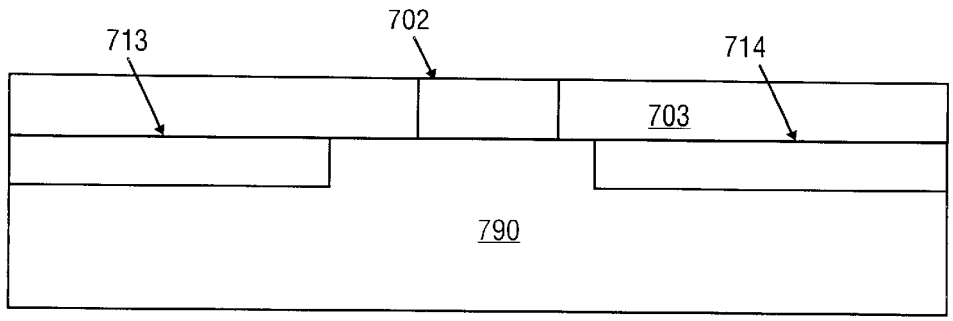

After spacers 764 are formed, impurities are deposited adjacent to them. Preferably, impurities are deposited by implanting ions into layer 790—preferably arsenic, antimony or phosphorus to make an n-MOS device or boron or indium to make a p-MOS device. Impurities preferably are implanted at $1 \times 10^{15} - 1 \times 10^{17}$ particles/cm$^3$ at an energy sufficient to form doped regions 713, 714, within layer 790 adjacent to spacers 764, that extend between about 1,000 and about 3,000 angstroms below the surface of layer 790, as shown in FIG. 7c. Although ion implantation is a preferred method for depositing impurities into layer 790, solid source diffusion or another type of deposition process may be used instead. When making an n-MOS device, polysilicon layer 790 should be doped P+. When making a p-MOS device, polysilicon layer 790 should be doped N+.

Figure 7E:
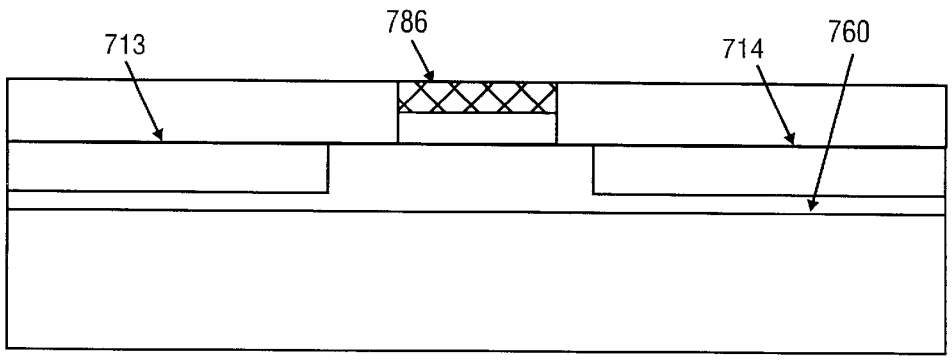

After the implant step, silicon dioxide may be deposited over the surface of the structure, which may or may not retain spacers 764 and hard mask 763. That silicon dioxide layer may then be polished down to the top of polysilicon layer 702 to produce the structure illustrated in FIG. 7d, which includes insulating layer 703 formed on regions 713, 714 formed within layer 790. Using steps like those described above in connection with FIG. 6e, silicide 786 may be formed on top of polysilicon layer 702. Ionized hydrogen may then be implanted at an energy sufficient to form continuous stress surface 760 preferably at least about 1,000 angstroms below doped regions 713, 714, as shown in FIG. 7e.

Figure 7F:
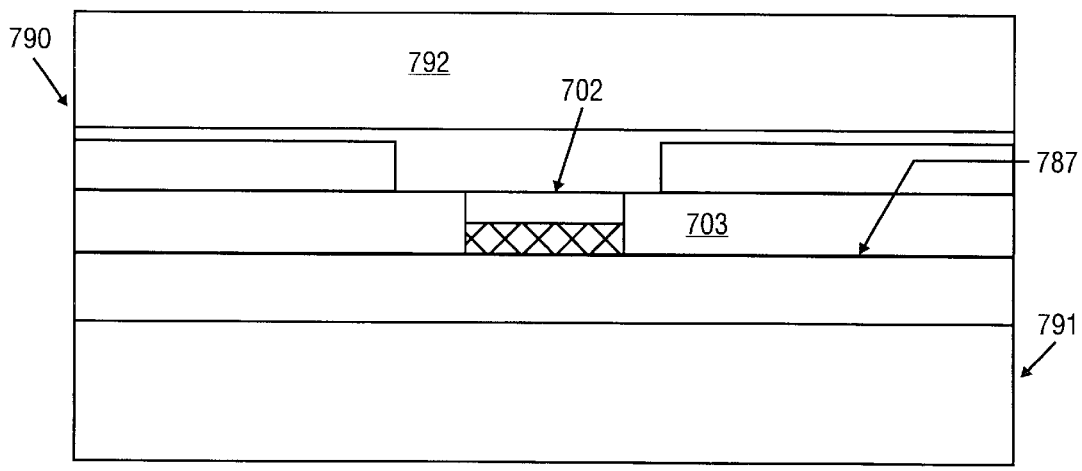
Figure 7G:
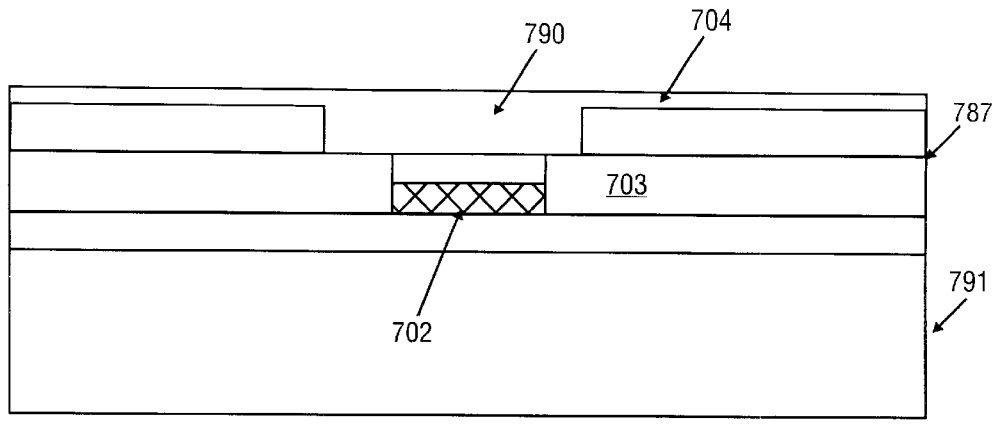

Following steps like those described above in connection with FIG. 6f, oxidized substrate 791 is placed next to body strap 702 (which now includes a polysilicon layer capped with a silicide) and insulating layer 703 along plane 787, as shown in FIG. 7f. Then, applying heating steps like those described above, section 792 of layer 790 is removed, oxidized substrate 791 is firmly bonded to body strap 702 and insulating layer 703 and a film resulting from the delamination step is polished down to produce film 704, as shown in FIG. 7g.

Figure 7H:
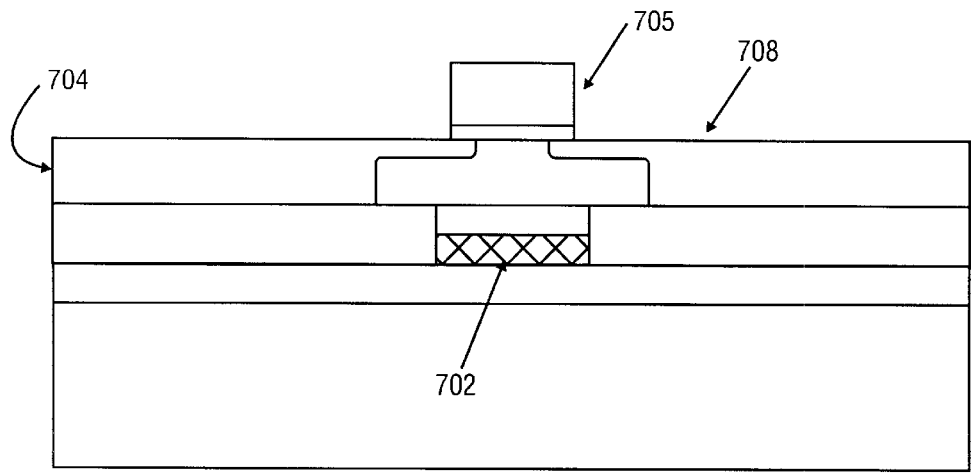
Figure 7I:
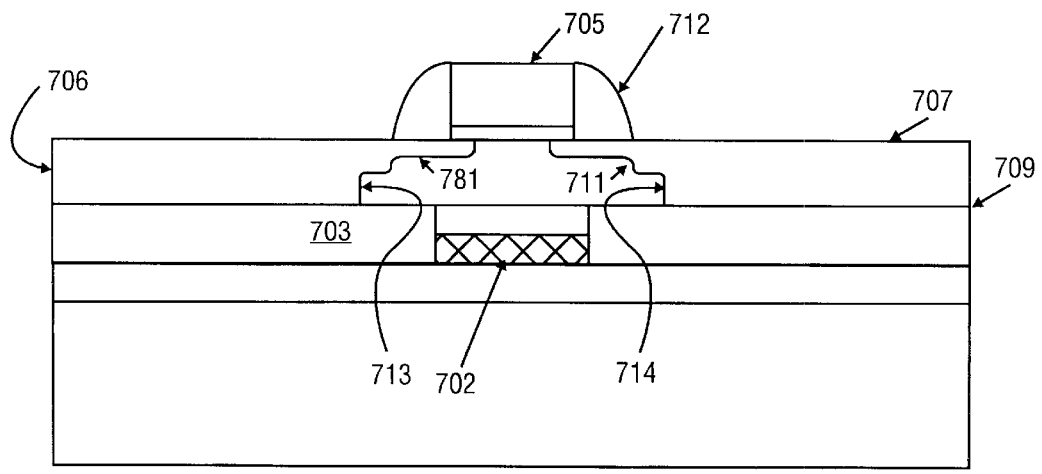

Subsequently, gate electrode 705 is formed on surface 708 of film 704 using body strap 702 as an alignment mark. An N− (or alternatively P−) implant step follows, as shown in FIG. 7h, which may be followed by formation of spacers 712 and an N+ (or alternatively P+) doping step. After applying appropriate thermal steps, junctions 781, 711 are formed, which extend down to surface 709 of insulating layer 703, as shown in FIG. 7i. By extending junctions 781, 711 in this manner, by forming regions 713, 714 prior to forming the subsequently implanted regions, the distance between those junctions and body strap 702 is reduced. By reducing that distance, the capacitance generated when applying an increased voltage to gate electrode 705, e.g., when the body tie (not shown) is charging, should be less than would have resulted had the junctions and body strap remained further apart.

Although FIGS. 7h–7i show gate electrode 705 and the N–/N+ regions substantially perfectly aligned with body strap 702, gate electrode 705 and these portions of doped regions 706, 707 may be shifted either left or right of center. One constraint on the degree of such misalignment is that the N–/N+ regions should not be shifted so far to either side of center that they cause one of regions 713, 714 to spread beneath one of spacers 712 to the point where the device's performance is adversely impacted.

Figure 8A:
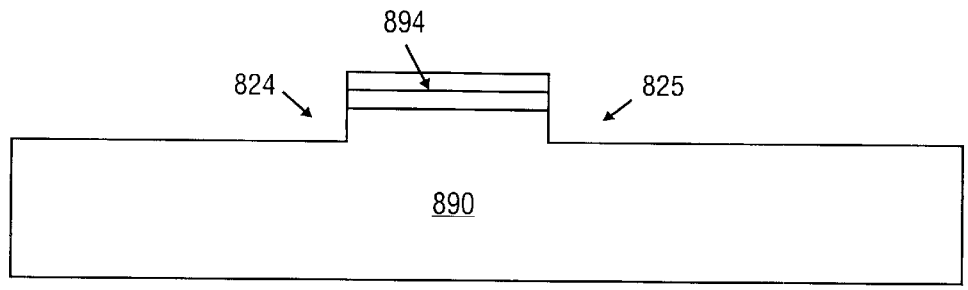
FIGS. 8a–8c are illustrations of cross-sections that reflect structures that may result after certain steps used to make the integrated circuit of FIG. 3 are combined with certain steps used to make the integrated circuit of FIG. 4.
Figure 8B:
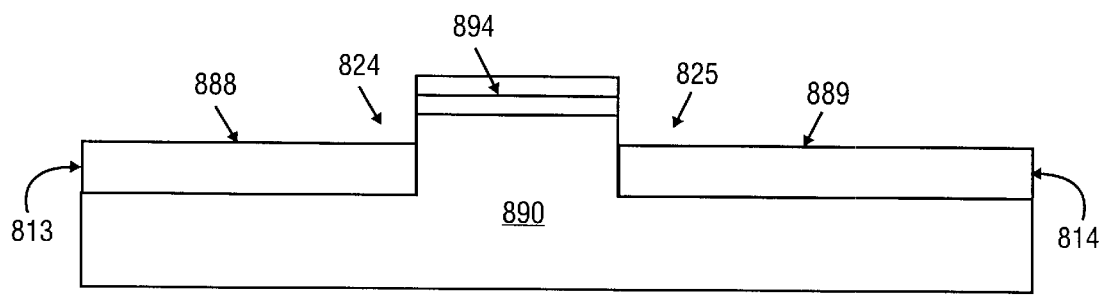
Figure 8C:
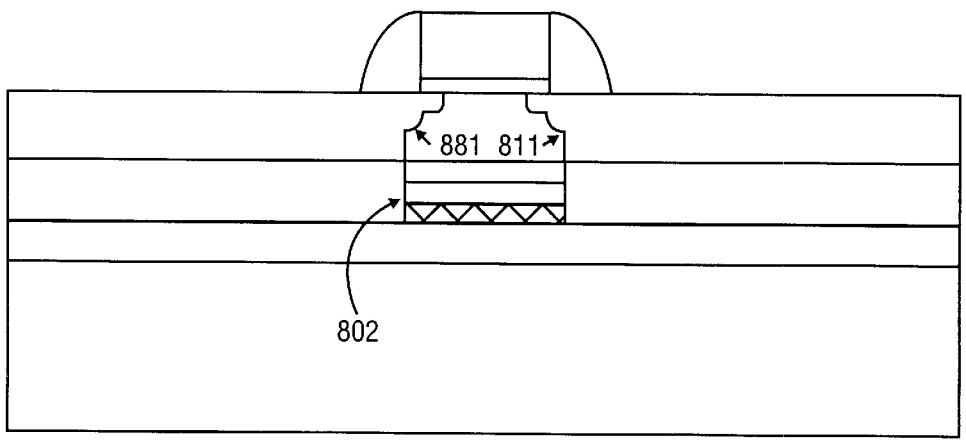

This process may be varied to produce a device similar to the one shown in FIG. 4, but without having to form spacers 764. As shown in FIG. 8a, such a process begins with a structure like that shown in FIG. 6c, which may be made using the steps set forth above for generating such a structure. That structure includes doped band 894 contained within first layer 890. Doped band 894 lies between trenches 824, 825. Impurities are then deposited into first layer 890 to form doped regions 813, 814 below surfaces 888, 889 of trenches 824 and 825, as shown in FIG. 8b. After that deposition step, the process steps described above in connection with FIGS. 7d–7i may be applied to create the structure shown in FIG. 8c. In this process, the separation between surfaces 888, 889 of trenches 824, 825 and doped band 894, as shown in FIG. 8b, ensures that there will be adequate spacing between body strap 802 and junctions 881 and 811, without the need for spacers 764 to provide further lateral spacing.

Features shown in the above figures are not intended to be drawn to scale, nor are they intended to be shown in precise positional relationship. Additional process steps that may be used to make the integrated circuit of the present invention have been omitted when not useful to describe aspects of the present invention.

Although the foregoing description has specified an integrated circuit that includes certain features, and has specified certain materials and process steps for making such an integrated circuit, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. An integrated circuit comprising:
   a first insulating layer formed on a substrate;
   a body strap of a first conductivity type formed on the first insulating layer, the body strap having upper and lower surfaces and first and second sides;
   a second insulating layer, having an upper surface, that is formed on the first insulating layer and formed adjacent to the body strap, the second insulating layer contacting the body strap along the entire length and width of the body strap's first and second sides;
   a film, having upper and lower surfaces, that is formed directly on the upper surface of the second insulating layer, the film's lower surface contacting the second insulating layer's upper surface;
   a gate electrode, having first and second sides, that is formed on the film;
   a pair of spacers that are formed on the first and second sides of the gate electrode; and
   a pair of heavily doped regions of a second conductivity type formed within the film that extend from the upper surface of the film to the upper surface of the second insulating layer, the heavily doped regions having junctions, each junction spaced from the body strap by at least about 500 angstroms due to the upper surface of the second insulating layer being at least about 500 angstroms removed from the upper surface of the body strap, and the heavily doped regions being spaced from the gate electrode by the spacers.

2. The integrated circuit of claim 1 wherein the film comprises an epitaxial layer of silicon that is less than about 1,000 angstroms thick and the body strap comprises doped silicon.

3. The integrated circuit of claim 1 wherein the second insulating layer is bonded to an oxidized substrate and the body strap comprises doped silicon.

4. The integrated circuit of claim 1 wherein the film comprises silicon and is greater than about 1,000 angstroms thick and the body strap comprises doped polysilicon.

5. The integrated circuit of claim 1 wherein the junctions are each spaced from the body strap by at least about 1,000 angstroms.

6. The integrated circuit of claim 1 wherein the body strap comprises a metal or metal silicide, has a width that is greater than the gate length for the gate electrode, and is misaligned with respect to the gate electrode.

7. An integrated circuit comprising:
   a first insulating layer formed on a substrate;
   a body strap of a first conductivity type formed on the first insulating layer, the body strap having upper and lower surfaces and first and second sides;
   a second insulating layer formed on the first insulating layer and formed adjacent to the body strap, the second insulating layer contacting the body strap along the entire length and width of the body strap's first and second sides;
   a film, having upper and lower surfaces, that is formed directly on an upper surface of the second insulating layer, the film's lower surface contacting the second insulating layers upper surface and the film being less than about 1,000 angstroms thick;
   a gate electrode, having first and second sides, that is formed on the film;
   a pair of spacers that are formed on the first and second sides of the gate electrode; and
   a first heavily doped region of a second conductivity type formed within the film that extends from the upper surface of the film to the upper surface of the second insulating layer, the first heavily doped region being spaced from the gate electrode by the spacers;
   wherein the distance between the body strap and the gate electrode is at least about 50% greater than the distance between the upper surface of the second insulating layer and the upper surface of the film.

8. The integrated circuit of claim 7 wherein the body strap comprises doped silicon.

9. The integrated circuit of claim 7 further comprising a second lightly doped region, the first heavily doped region and the second lightly doped region each having junctions, each junction separated from the body strap by at least about 500 angstroms, and the lightly doped region being located between the heavily doped region and the gate electrode.

10. The integrated circuit of claim 7 wherein the body strap comprises a metal or metal silicide, has a width that is greater than the gate length for the gate electrode, and is misaligned with respect to the gate electrode.

* * * * *

UNITED STATES PATENT AND TRADEMARK OFFICE
CERTIFICATE OF CORRECTION

PATENT NO. : 6,489,655 B2
DATED : December 3, 2002
INVENTOR(S) : Doyle et al.

It is certified that error appears in the above-identified patent and that said Letters Patent is hereby corrected as shown below:

Column 7,
Line 1, delete "suicide", insert -- silicide --.

Signed and Sealed this

Eighth Day of April, 2003

JAMES E. ROGAN
*Director of the United States Patent and Trademark Office*